(12) United States Patent
Grewing et al.

(10) Patent No.: US 7,030,667 B2
(45) Date of Patent: Apr. 18, 2006

(54) FREQUENCY CONVERSION CIRCUIT ARRANGEMENT AND MOBILE RADIO COMPRISING SAID CIRCUIT ARRANGEMENT

(75) Inventors: Christian Grewing, Sollentuna (SE); André Hanke, Düsseldorf (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/940,114

(22) Filed: Sep. 14, 2004

(65) Prior Publication Data

US 2005/0107063 A1 May 19, 2005

Related U.S. Application Data

(63) Continuation of application No. PCT/DE03/00478, filed on Feb. 17, 2003.

(30) Foreign Application Priority Data

Mar. 15, 2002 (DE) ................................ 102 11 524

(51) Int. Cl.
*H03B 19/00* (2006.01)
*H04B 1/26* (2006.01)

(52) U.S. Cl. ...................................... 327/113; 455/323
(58) Field of Classification Search ................ 327/113; 455/313, 323
See application file for complete search history.

(56) References Cited

U.S. PATENT DOCUMENTS

6,816,021 B1 * 11/2004 Hahn et al. ................... 331/74

FOREIGN PATENT DOCUMENTS

| DE | 34 12 191 A1 | 10/1985 |
|----|-------------|---------|
| DE | 35 33 104 A1 | 4/1987 |
| DE | 44 97 767 C2 | 2/1999 |
| DE | 198 19 038 A1 | 11/1999 |
| EP | 1 178 604 A1 | 2/2002 |

OTHER PUBLICATIONS

International Search Report, Int. Application No. PCT/DE03/00478, 2 pgs.

* cited by examiner

*Primary Examiner*—David Mis
(74) *Attorney, Agent, or Firm*—Eschweiler & Associates, LLC

(57) ABSTRACT

A frequency conversion circuit arrangement is disclosed providing a complex output signal at its output. The circuit comprises two frequency mixers that are driven, on the one hand, by an input signal and, on the other hand, by a feedback signal. In this case, the feedback signal is the frequency-divided output signal and has been broken down into an in-phase component and a quadrature component. The frequency conversion circuit provides a signal at an output frequency in a manner independent of production tolerances and accurately in terms of frequency, said signal being in the form of an IQ signal and additionally being decoupled, in terms of frequency, from the input signal. The frequency conversion circuit is therefore particularly well suited to use in mobile radio transceivers.

13 Claims, 1 Drawing Sheet

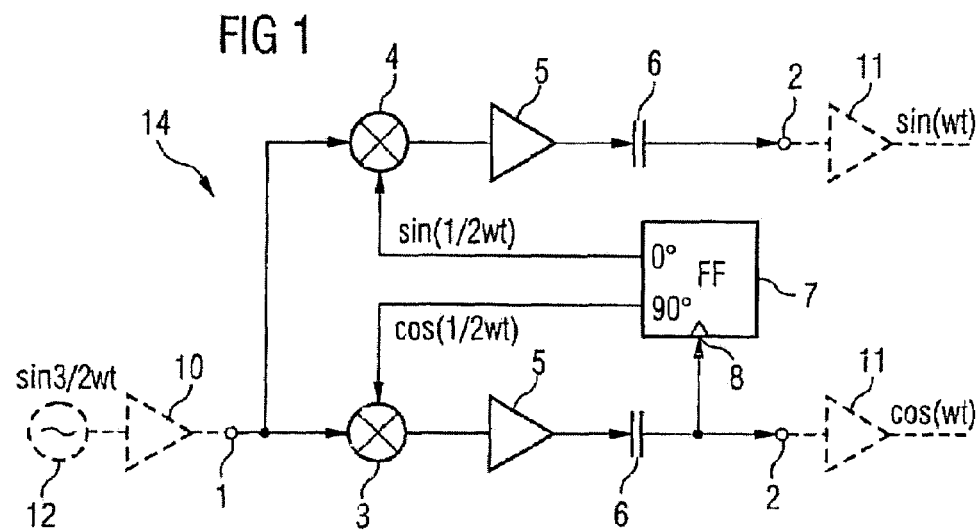
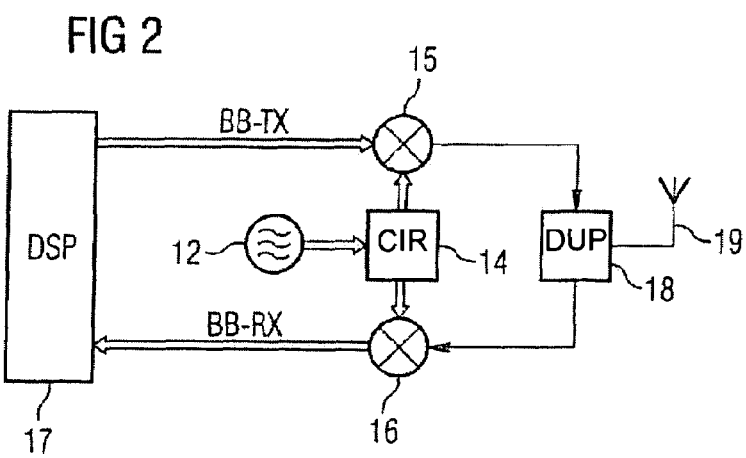

US 7,030,667 B2

FREQUENCY CONVERSION CIRCUIT ARRANGEMENT AND MOBILE RADIO COMPRISING SAID CIRCUIT ARRANGEMENT

REFERENCE TO RELATED APPLICATIONS

This application is a continuation of PCT/DE03/00478, filed Feb. 17, 2003 which was not published in English, that claims the benefit of the priority date of German Patent Application No. DE 102 11 524.9, filed on Mar. 15, 2002, the contents of which both are herein incorporated by reference in their entirety.

FIELD OF THE INVENTION

The present invention relates to a frequency conversion circuit arrangement and to a mobile radio having that circuit arrangement.

BACKGROUND OF THE INVENTION

Complex-value signal processing is usually used in modern transmitting and receiving arrangements (for example in mobile radio) which have a relatively wide bandwidth. In this case, quadrature modulators, for example vector modulators, are used for frequency conversion in the transmission direction. In the reception direction, for example in a low IF receiver structure, a local oscillator signal (LO signal) is used to down-mix the received signal to a relatively low intermediate frequency level. The requirement that the local oscillator signal and the carrier signal must be in the form of complex signals, that is to say comprise two signal components which have been phase-shifted through 90° with respect to one another, is imposed on transmitter and receiver architectures having complex-valued signal processing. An orthogonal signal of this type comprises an in-phase signal component and a quadrature signal component.

However, conventional local oscillators which are usually used to produce carrier signals and local oscillator signals provide only so-called single-ended signals. Phase shifters are usually used to produce the phase shift which is therefore still required to produce two orthogonal signal components, with the accuracy of the phase shift directly influencing the receiver's characteristic data, in particular as regards mirror-image frequency suppression.

In addition, the oscillator in modern transmitting and receiving architectures does not usually oscillate at the transmission frequency but rather at a frequency which can be converted to the transmission frequency with as little effort as possible. This is associated with the advantage that effects of the transmission frequency on the oscillator, which is in the form, for example, of a VCO (Voltage Controlled Oscillator), can be diminished.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

The present invention is directed to a frequency conversion circuit arrangement that provides the output signal in the form of a complex signal and, in the process, diminishes the effects of the output frequency on the input frequency of the circuit. The present invention also includes a mobile radio having such a circuit arrangement, wherein the mobile radio is improved with respect to mirror-image frequency suppression, current requirement and phase noise.

In one aspect of the present invention, the frequency conversion circuit arrangement comprises an input configured to supply an input signal at an input frequency, and an output configured to tap off a complex output signal at an output frequency (which is dependent on the input frequency) that comprises an in-phase path and a quadrature path.

The arrangement further comprises a first frequency mixer having a first input connected to the input of the circuit arrangement, a second input and an output coupled to the output of the circuit arrangement. In addition, a second frequency mixer is provided having a first input connected to the input of the circuit arrangement, a second input and an output coupled to the output of the circuit arrangement. Lastly, a frequency divider is included and has an input coupled to the output of the first frequency mixer, an in-phase output coupled to the second input of the second frequency mixer and a quadrature output coupled to the second input of the first frequency mixer. The frequency divider is configured to supply a respective signal component of a signal at a divided-down output frequency.

In accordance with the present invention, an input signal at an input frequency is converted to an output signal at an output frequency, with the output frequency being dependent on the input frequency. The output signal at the output frequency is in the form of a complex signal and comprises an in-phase component and a quadrature component which are orthogonal to one another. The in-phase and quadrature components of the output signal have accordingly been phase-shifted through 90° with respect to one another.

In accordance with the present invention, the input signal is not split into two signal paths that are each routed to inputs of frequency mixers, but rather the input signal is supplied to one input of each of the frequency mixers. The output signal (at the output frequency) from at least one of the two frequency mixers is fed back to the respective second inputs of the frequency mixers. This corresponds to using a frequency divider to divide the frequency of this feedback signal, that is to say of supplying the output signal at the divided-down frequency to the two inputs of the two frequency mixers. In this case, the frequency divider has two signal outputs that are orthogonal to one another, so that the feedback signal is supplied to the frequency mixers in two signal components which have been phase-shifted through 90° with respect to one another. As a result, the signal components at the outputs of the two frequency mixers have also been phase-shifted through 90° with respect to one another and together form the desired IQ output signal of the present frequency converter.

In accordance with the present invention, decoupling of the input frequency from the output frequency is ensured with little effort. In addition, the frequency conversion operation described herein exhibits a low power consumption and good phase noise characteristics on account of the simple design of the frequency conversion circuit. The linearity requirements imposed on the two frequency mixers are low in this case, so that said frequency mixers contribute to the low power consumption of the circuit.

The complex output signal from the circuit arrangement may be used both for step-up frequency conversion in a transmission path, for example in vector modulators, and as a local oscillator signal for step-down frequency conversion. In this case, the frequency conversion circuit described operates with a high degree of accuracy given a small amount of circuitry complexity.

In accordance with the present invention, the orthogonal signal components are produced during frequency conversion of the input signal. In this case, the two frequency mixers are driven in such a manner that the output signal is present at the outputs thereof in the form of a signal that has been broken down into IQ components. The frequency feedback path of the frequency converter is used in this case. In accordance with the present invention, the accuracy of the phase angle of the output signal and its components is not dependent on RC tolerances, that is to say on manufacturing tolerances of integrated components, and is also independent of frequency. Furthermore, two frequency mixers together have a considerably lower power consumption than one frequency mixer and one phase shifter (which is usually provided and is in the form, for example, of an RC all-pass filter).

The two frequency mixers in the frequency conversion circuit, in one example, comprise step-up frequency mixers.

The frequency divider is, in one example, in the form of a frequency divider having a division factor of 2. In this case, the input frequency corresponds to 1.5 times the output frequency, that is to say an oscillator connected to the input of the frequency conversion circuit oscillates at 1.5 times the desired output frequency. Frequency dividers having a division factor of 2 can be implemented in a particularly simple manner.

In one exemplary embodiment, the frequency divider comprises a flip-flop module having two orthogonal outputs that each drive one of the two frequency mixers. A flip-flop of this type makes it possible, in a simple manner, to divide the frequency by two in the feedback path (in accordance with the present invention) and to split the signal into orthogonal components which are intended to drive the two frequency mixers.

In this example, an output of one of the two frequency mixers is coupled to the clock input of the flip-flop for the purpose of forming the feedback path.

A means for decoupling the DC component(s) of the output signal, in one example, is respectively connected between the output of the frequency mixers and the output of the circuit and thus between the output of one of the two frequency mixers and the input of the frequency divider. The means for decoupling the DC component(s), in one example, comprises a series capacitor and suppresses the DC components that may occur in the output signal in accordance with the present invention and may result from frequency mixing.

A mobile radio is disclosed having a circuit arrangement with the features described above, comprising at least one device configured to convert the frequency of a wanted signal between baseband and a radio frequency that has an auxiliary input to supply a complex signal at a carrier frequency. The mobile radio further includes a frequency generator which provides a reference signal at a reference frequency at an output. The input of the frequency conversion circuit arrangement is coupled to the output of the frequency generator which has an output coupled to the auxiliary input of the frequency conversion device.

As already indicated, the present frequency conversion circuit is particularly suited to driving frequency converters, modulators and demodulators in mobile radios. In this case, a frequency generator, for example a VCO, is connected to the input of the circuit arrangement. The output of the circuit is connected to a device for converting the frequency of a wanted signal. Since the present frequency conversion circuit is suited to drive frequency converters both in transmission paths and in reception paths of mobile radios, the output of the frequency conversion circuit arrangement may be connected both to an input of a step-up frequency mixer in a transmission path and to the input of a step-down frequency mixer in a reception path.

The mobile radio described herein makes it possible to provide carrier frequencies and local oscillator frequencies in the form of IQ signals with little complexity, independently of production and accurately in terms of frequency, and at the same time to design transmitting and/or receiving architectures with complex-value signal processing of a wanted signal.

BRIEF DESCRIPTION OF THE DRAWINGS

The invention is explained in more detail below using one exemplary embodiment and with reference to the single figure, in which:

FIG. 1 is a simplified block diagram illustrating one exemplary embodiment of the frequency conversion circuit in accordance with the present principle, and FIG. 2 is a simplified block diagram illustrating one exemplary embodiment of a mobile radio having a frequency conversion circuit as shown in FIG. 1.

DETAILED DESCRIPTION OF THE INVENTION

FIG. 1 shows a frequency conversion circuit arrangement having an input 1, which is in the form of a single-ended input and is designed to supply an input signal $\sin[(3/2)\omega t]$ at an input frequency, and an IQ output 2 which is in the form of an output terminal pair for tapping off a complex output signal $\sin(\omega t)$, $\cos(\omega t)$ at an output frequency which is dependent on the input frequency. A first frequency mixer 3 and a second frequency mixer 4 which are in the form of step-up frequency converters are furthermore provided. The frequency mixers 3, 4 each have a first input, a second input and an output. The first inputs of the frequency mixers 3, 4 are connected to the input 1 of the circuit arrangement. The second inputs of the frequency converters 3, 4 are connected to a feedback path which will be described in more detail later on. A buffer amplifier 5 with a downstream series capacitor 6 is connected to the outputs of each of the frequency converters 3, 4.

A clock input 8 of a flip-flop module 7 is connected to the output of that series capacitor 6 which is coupled to the frequency mixer 3. The output of the series capacitor 6 which is coupled to the output of the first frequency mixer 3 is furthermore connected to an output terminal of the IQ output 2. The series capacitor 6 which is coupled to the output of the second frequency converter 4 is likewise connected to an output terminal of the IQ output 2 of the frequency conversion circuit. The flip-flop 7 which divides the frequency by 2 has two outputs which are in the form of a 0° output and a 90° output and are designed to tap off two signal components which have been phase-shifted through 90° with respect to one another. Each of the two outputs of the flip-flop 7 (which operates as a frequency divider) is connected to a second input of each of the two frequency mixers 3, 4.

The frequency conversion circuit (which has been described so far) between the input 1 and output 2 is provided with reference symbol 14. A frequency generator 12 which provides a corresponding oscillator signal is connected to the input 1 for the purpose of supplying the input signal at the input frequency $\sin[(3/2)\omega t]$. The output of the frequency generator (for example, in the form of a voltage-controlled oscillator 12) is connected to the input 1 via a buffer amplifier 10. A frequency converter in a mobile radio is connected to the output pair 2, for example via further buffer amplifiers 11 (in this respect, see FIG. 2 below). An output signal at the output angular frequency $\omega$ can be derived from the outputs 2 of the frequency conversion circuit 14, so that an in-phase path and a quadrature path may be derived via a corresponding sine signal and cosine signal which are described by $\sin(\omega t)$ and $\cos(\omega t)$. The frequency mixers 3, 4 each mix a feedback signal (which is provided by the flip-flop 7) with the input signal. In this case, the feedback signal is at half the output frequency and is described by the expressions $\sin[(1/2)\omega t]$ and $\cos[(1/2)\omega t]$ in the components of the complex feedback signal. If these feedback signal components are mixed with the input signal in the frequency mixers 3, 4, this results, at the outputs of the frequency mixers, in the desired frequencies at the angular frequency $\omega$, on the one hand, and additionally undesirable frequency components at twice the angular frequency $2\omega$ which can be suppressed, in a simple manner without any problems, by means of low-pass filters or by designing the step-up mixers as mixers which suppress mirror-image frequencies or by means of other measures which are familiar to those skilled in the art of radio-frequency technology.

The simple design without an RC all-pass filter makes it possible to produce the present frequency conversion circuit as shown in FIG. 1 such that it has a low power consumption, a high frequency accuracy and is largely independent of process tolerances. In addition, the output frequency is decoupled from the input frequency, as desired, thus avoiding effects of the output frequency on the oscillator 12. The power consumption of the circuit shown in FIG. 1 is relatively low since there is no need for an RC all-pass filter.

FIG. 2 shows one application example of the frequency conversion circuit 14 (shown in FIG. 1) in a mobile radio. The mobile radio has a transmission path and a reception path, with a step-up frequency converter 15 being provided in the transmission path and a step-down frequency converter 16 being provided in the reception path, each of said converters being designed to process complex wanted signals. In the transmission path, the frequency converter 15 is connected, via a basic signal path, to the output of a digital signal processor 17 which provides a baseband modulation signal BB-TX.

The output of the frequency converter 15 is coupled to a duplexing unit 18 which is connected to an antenna 19. The duplexing unit 18 is furthermore connected to the input of a step-down frequency converter 16 in the reception path, which is in turn connected, via a baseband signal processing path, to an input of the digital signal processor unit 17 for the purpose of supplying a demodulated baseband signal BB-RX. The frequency converters 15, 16 for processing the wanted signals each have an auxiliary input for the purpose of supplying a carrier signal or a local oscillator signal. Said signal is produced by a frequency generator 12 and is conditioned in the frequency conversion circuit arrangement 14. For this purpose, the input 1 of the frequency conditioning circuit 14 is coupled to the output of the frequency generator 12. The output 2 of the frequency conditioning circuit 14 is connected to an auxiliary input of each of the frequency mixers 15, 16.

The transceiver shown in FIG. 2 is particularly well suited to mass production on account of the low power consumption as well as the high frequency accuracy and the small amount of chip surface area occupied by the frequency mixers 3, 4 and the fact that low linearity requirements are imposed on the latter.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

The invention claimed is:

1. A frequency conversion circuit, comprising:
   an input configured to supply an input signal at an input frequency;
   an output configured to tap off a complex output signal at an output frequency that is dependent on the input frequency, wherein the output comprises an in-phase path and a quadrature path;
   a first frequency mixer comprising a first input connected to the input of the frequency conversion circuit, a second input and an output coupled to the output of the frequency conversion circuit;
   a second frequency mixer comprising a first input connected to the input of the frequency conversion circuit, a second input and an output coupled to the output of the frequency conversion circuit; and
   a frequency divider comprising an input coupled to the output of the first frequency mixer, an in-phase output coupled to the second input of the second frequency mixer, and a quadrature output coupled to the second input of the first frequency mixer, wherein the frequency divider is configured to supply a respective signal component of a signal input thereto at a divided-down output frequency.

2. The circuit arrangement as claimed in claim 1, wherein the frequency divider comprises a divide-by-two frequency divider.

3. The circuit arrangement as claimed in claim 1, wherein the frequency divider comprises a flip-flop having a zero degree output and a 90 degree output which form the in-phase and quadrature outputs of the frequency divider, respectively.

4. The circuit arrangement as claimed in claim 3, wherein the flip-flop comprises a clock input that forms the input of the frequency divider.

5. The circuit arrangement as claimed in claim 1, further comprising a means for decoupling a DC component of the output signal, wherein the means is coupled between the output of the first frequency mixer and the input of the frequency divider.

6. The circuit arrangement as claimed in claim 5, wherein the means for decoupling the DC component comprises a capacitor.

7. The circuit arrangement as claimed in claim 1, further comprising a means for decoupling a DC component of the output signal, wherein the means is coupled to the output of the second frequency mixer.

8. The circuit arrangement as claimed in claim 5, wherein the means for decoupling the DC component comprises a capacitor.

9. A mobile radio system, comprising:
at least one mixer device configured to convert a frequency of a signal between a baseband frequency and a radio frequency, the device comprising an auxiliary input configured to receive a complex signal at a carrier frequency;
a frequency generator configured to provide a reference signal at a reference frequency at an output thereof; and
a frequency conversion circuit comprising an input coupled to the output of the frequency generator, and comprising an output coupled to the auxiliary input of the mixer device, wherein the frequency conversion circuit comprises:
an input configured to receive the reference signal at the reference frequency;
an output configured to tap off a complex output signal at the carrier frequency that is different than and dependent on the reference frequency, wherein the output comprises an in-phase path and a quadrature path;
a first frequency mixer comprising a first input connected to the input of the frequency conversion circuit, a second input and an output coupled to the output of the frequency conversion circuit;
a second frequency mixer comprising a first input connected to the input of the frequency conversion circuit, a second input and an output coupled to the output of the frequency conversion circuit; and
a frequency divider comprising an input coupled to the output of the first frequency mixer, an in-phase output coupled to the second input of the second frequency mixer, and a quadrature output coupled to the second input of the first frequency mixer, wherein the frequency divider is configured to supply a respective signal component of a signal input thereto at a divided-down output frequency.

10. A frequency conversion circuit, comprising:
an input node configured to receive an input signal having a first frequency;
first and second output nodes configured to provide respective components of a complex signal output, wherein the respective components are orthogonal to one another, the complex output signal components having a second frequency that is different than, and a function of, the first frequency;
a first mixer circuit comprising a first input coupled to the input node and configured to receive the input signal having the first frequency, a second input, and an output coupled to the second output node;
a second mixer circuit comprising a first input coupled to the input node and configured to receive the input signal having the first frequency, a second input, and an output coupled to the first output node; and
a divider circuit comprising an input coupled to the output of the first frequency mixer, and comprising two outputs, wherein a first output is coupled to the second input of the second mixer circuit and provides a first divided signal having a third frequency different than the first and second frequencies, and substantially in phase with the input signal, and a second output is coupled to the second input of the first mixer circuit and provides a second divided signal having the third frequency that is out of phase with the input signal,
wherein the second mixer circuit is configured to output an in-phase complex signal output component having the second frequency based on a mixing of the input signal and the first divided signal at the first output node, and wherein the first mixer circuit is configured to output a quadrature complex signal output component having the second frequency based on a mixing of the input signal and the second divided signal at the second output node.

11. The frequency conversion circuit of claim 10, further comprising a DC component decoupling circuit coupled between the output of the first mixer circuit and the second output node.

12. The frequency conversion circuit of claim 10, further comprising a DC component decoupling circuit coupled between the output of the second mixer circuit and the first output node.

13. The frequency conversion circuit of claim 10, wherein the divider circuit comprises a flip-flop circuit, wherein the input of the divider circuit comprises a clock input of the flip-flop circuit, and wherein the flip-flop circuit is configured to provide signals at the first and second outputs at the third frequency that is half of the second frequency.

* * * * *